US011038348B2

(12) United States Patent
Vakilian et al.

(10) Patent No.: US 11,038,348 B2
(45) Date of Patent: Jun. 15, 2021

(54) TWO STAGE POWER CONTROL SYSTEM FOR AUTOMOTIVE DEVICES (71) Applicant: Avago Technologies International Sales Pte. Limited, Singapore (SG)

(72) Inventors: Kambiz Vakilian, Irvine, CA (US); Jingguang Wang, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 153 days.

(21) Appl. No.: 16/517,200

(22) Filed: Jul. 19, 2019

(65) Prior Publication Data
US 2019/0341774 A1 Nov. 7, 2019

Related U.S. Application Data (63) Continuation of application No. 15/067,445, filed on Mar. 11, 2016, now Pat. No. 10,361,558.

(60) Provisional application No. 62/292,696, filed on Feb. 8, 2016.

(51) Int. Cl.
*H02J 1/00* (2006.01)
*H02J 9/00* (2006.01)
*H01L 49/02* (2006.01)
*H02J 50/80* (2016.01)
*H01L 27/00* (2006.01)
*H05B 47/18* (2020.01)

(52) U.S. Cl.
CPC ............... *H02J 1/00* (2013.01); *H01L 27/00* (2013.01); *H01L 28/00* (2013.01); *H02J 9/005* (2013.01); *H02J 50/80* (2016.02); *H05B 47/18* (2020.01); *H02J 9/007* (2020.01)

(58) Field of Classification Search
CPC ..... H02J 1/00; H02J 50/80; H02J 9/00; H05B 47/18; H01L 27/00; H01L 28/00; H01L 49/02
See application file for complete search history.

(56) References Cited

U.S. PATENT DOCUMENTS

| 8,630,741 | B1 | 1/2014 | Matsuoka et al. |
| 8,977,869 | B2 | 3/2015 | Wang et al. |
| 2006/0176040 | A1 | 8/2006 | Kernahan et al. |
| 2010/0182867 | A1 | 7/2010 | Lee |
| 2012/0133635 | A1 | 5/2012 | Ji et al. |
| 2013/0219198 | A1 | 8/2013 | Kuroishi et al. |
| 2013/0330074 | A1 | 12/2013 | Kikuzawa et al. |

(Continued)

OTHER PUBLICATIONS

Final Office Action on U.S. Appl. No. 15/067,445 dated Jan. 23, 2019.

(Continued)

*Primary Examiner* — Robert L Deberadinis
(74) *Attorney, Agent, or Firm* — Foley & Lardner LLP (57) ABSTRACT A system and method includes a power control circuit for controlling first power from a power supply provided to a first circuit includes a first stage and a second stage. The first stage includes a low power energy detector and a first power switch. The low power energy detector is configured to provide second power via the first switch in response to energy. The second stage includes a signal detector configured to detect a characteristic of a signal associated with the energy in response to the second power. The signal detector is configured have the first power provided to the first circuit in response to the characteristic being detected.

20 Claims, 4 Drawing Sheets (56) References Cited

U.S. PATENT DOCUMENTS

2015/0134136 A1     5/2015   Lydecker et al.
2016/0098071 A1     4/2016   Itou et al.

OTHER PUBLICATIONS

Non-Final Office Action on U.S. Appl. No. 15/067,445 dated Sep. 20, 2018.
Notice of Allowance on U.S. Appl. No. 15/067,445 dated Mar. 13, 2019.

TWO STAGE POWER CONTROL SYSTEM FOR AUTOMOTIVE DEVICES

CROSS REFERENCE TO RELATED APPLICATIONS

This application is a continuation of and claims priority to and the benefit of U.S. patent application Ser. No. 15/067,445, entitled "TWO STAGE POWER CONTROL SYSTEM FOR AUTOMOTIVE DEVICES," filed Mar. 11, 2016, which claims priority to and the benefit of U.S. Provisional Application No. 62/292,696, entitled "TWO STAGE POWER SYSTEM," filed Feb. 8, 2016, the contents of which are incorporated herein by reference in their entirety for all purposes.

BACKGROUND OF THE DISCLOSURE

In the last few decades, the market for low power automotive electronic devices has grown by orders of magnitude, fueled by the use of communication, sensing, storage, computing devices and increased connectivity and data transfer in cars and other portable devices. Furthermore, circuit fabrication improvements, as well as advances in circuit integration and other aspects have made electronic equipment smaller, cheaper, and more reliable. Automotive electronic circuits associated with communication, sensing, storage and computing devices as well as other portable electronic devices can operate in idle mode where zero or little power is consumed to save battery power. Meanwhile these circuits should exit idle mode correctly by a wakeup signal.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Described herein with reference to FIGS. 1-5 are systems and methods for controlling power to devices (e.g., controlling idle or power down modes). Such systems and methods can be used in virtually any application that uses or can benefit from reduction in power consumption or heat production. Applications include but are not limited to communication, sensing, computing, storing or other electronic applications. In some embodiments, the systems and methods described herein can be utilized in circuitry for any communication, sensing, storing, or computing device.

Electronic devices include integrated circuits (ICs) that can be operated in an idle mode with no or little power being supplied to the IC. For various applications, the leakage current of the electronic devices can cause battery power drainage. In a power down mode, the power supply to the IC can be disconnected to eliminate current leakage. ICs often use an always on signal detector that monitors signals provided to the IC and powers on the IC (the IC leaves the idle mode) in response to the signals. Such always on signal detectors often consume power, can be susceptible to noise (especially in an automotive environment), and provide false wake ups.

In some embodiments, an integrated circuits (ICs) includes or is in communication with a two stage power up detection and/or control system that monitors signal activity on the data or other lines of the IC and wakes up the IC with less susceptibility to noise. In some embodiments, the two stage power up detection system includes at least a first stage and a second stage and provides very robust signal detection and meets a very stringent power requirements. In some embodiments, the first stage includes an always on ultra-low power detector (e.g., consumes a 5 microamps ($\mu$A) or less (e.g., 3 or $\mu$A) during detection operations), and the second stage includes a detector that more accurately detects presence of a signal. The second stage consumes more power than the first stage and has the capability to accurately measure and examine signal strength, pattern and/or duration to prevent false wake-ups in some embodiments.

In some embodiments, the systems and methods are used in automotive applications, which have very stringent power requirements, to control power provided to Ethernet physical layer ICs. In some embodiments, the systems and methods take advantage of self-contained power on/off control, thereby making system integration easier and reducing the need for additional power management. In some embodiments, the systems and methods do not use remote power on/off control by the Ethernet central unit that requires an additional control cable to operate a power switch, thereby saving cabling, cost and weight.

In some embodiments, a power control circuit for controlling first power from a power supply provided to a first circuit includes a first stage and a second stage. The first stage includes a low power energy detector and a first power switch. The low power energy detector is configured to provide second power via the first switch in response to energy. The second stage includes a signal detector configured to detect a characteristic of a signal associated with the energy in response to the second power. The signal detector is configured have the first power provided to the first circuit in response to the characteristic being detected.

In some embodiments, a method is used to provide a power signal. The method includes detecting a signal at an input of a first circuit using a first circuit in a first power mode, and validating the signal using a second circuit in a second power mode. The method also providing the power signal to a third circuit if the first signal is validated.

In some embodiments, an apparatus includes a first detector, a second detector, a first power switch, and a second power switch. The first power switch includes a first control input and a first power output, the first control input being coupled the first detector and the first power output being coupled to the second detector. The second power switch comprising a second control input and a second power output, the second control input being coupled the second detector. The first detector is configured to operate in a first power mode and is configured to detect a signal and control the first power switch to provide first power to the first power output in response to a detection of the signal. The second detector is configured to operate in a second power mode and is configured to validate the signal and control the second power switch to provide second power to the second power output in response to a validation of the signal.

Figure 1:
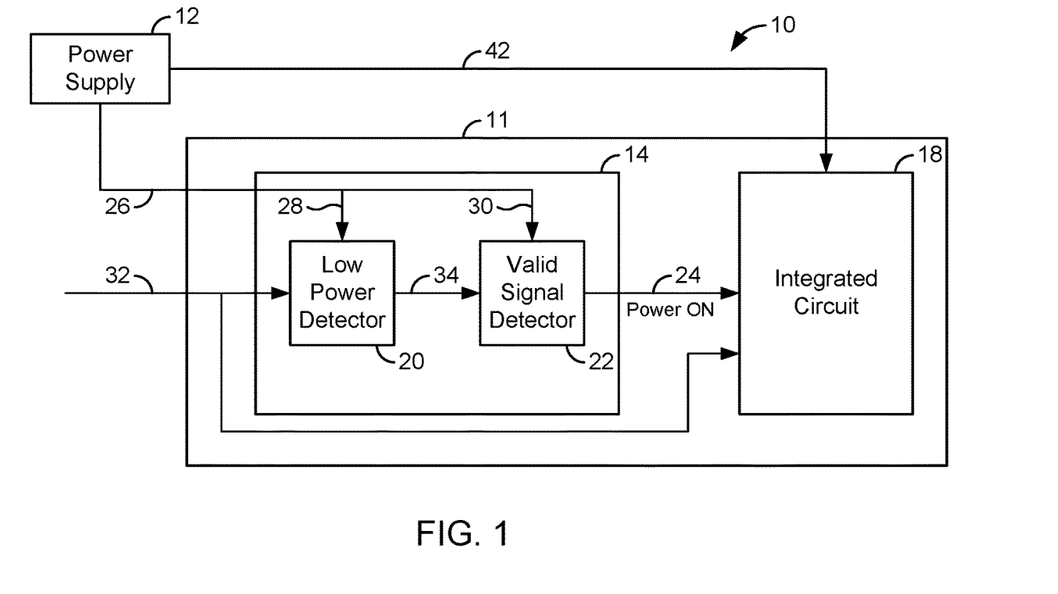
FIG. 1 is a schematic general block diagram of a circuit including a two stage power control circuit for use with an IC in accordance with some embodiments.

With reference to FIG. 1, a system 10 includes a circuit 11 and a power supply 12. System 10 can be any type of electronic system or device including a communication, computing, sensing, storage or other device.

Circuit 11 can be any part of system 10. In some embodiments, circuit 11 includes, is part of, or associated with an integrated circuit (IC) 18. In some embodiments, circuit 11 includes a power control circuit 14. Power control circuit 14 is part of IC 18 or is a separate circuit from IC 18 in some embodiments. IC 18 is any type of IC including but not limited to an IC for a network, a hotspot, a computer, a phone, a tablet, a camera, a storage device, a sensor, a display, a microphone, a speaker, or a medical device. In some embodiments, IC 18 is capable of an idle mode where little or no power from power supply 12 is consumed by the IC 18.

Power supply 12 is any system or device for providing power to circuit 11. Power supply 12 is a battery, super capacitor, capacitive bank, solar cell, a power converter, or other device for providing electric power to the circuit 11. The power from power supply 12 is provided to IC 18 under the control of power control circuit 14. Power supply 12 provides power as a direct current (DC) power signal at 1.8 Volts (V) DC, 3.3 VDC, 5 VDC, or 12 VDC in some embodiments. The voltage levels and types of signals discussed above are exemplary only; other voltage levels and types of signals can be utilized.

Power control circuit 14 removes power provided from power supply 12 to IC 18 when in an idle mode and awakens IC 18 from the idle mode and allows power to be provided power from power supply 12 when signals or conditions indicate IC 18 should be awaken from the idle mode. Power control circuit 14 includes switches, regulators or other devices for controlling power supplied to IC 18 and power control circuit 14 in some embodiments.

In some embodiments, power control circuit 14 includes two stages. In some embodiments, a first stage includes a low power detector 20 and a second stage includes a valid signal detector 22. In some embodiments, low power detector is 20 a passive detector and valid signal detector 22 is an active detector. Power control circuit 14 detects energy at an input 32, such as, signals, disturbances, or other criteria indicative of a need or desire to wake up IC 18, using low power detector 20. In some embodiments, input 32 is a data line, signal line, or other input. When the energy is above a threshold, power control circuit 14 validates the signal using valid signal detector 22 and if validated, the power control circuit 14 causes power from power supply 12 to IC 18 at input 42 via a control signal (e.g., a power on signal) at an input 24. IC 18 responds to the signal at input 32 when powered on in some embodiments. Using valid signal detector 22 to validate the energy as a signal for IC 18 reduces false wakeups in some embodiments.

In some embodiments, low power detector 20 is continuously or near continuously powered by power supply 12 via an input 28. Low power detector 20 consumes less than a few microamperes of current in some embodiments. Valid signal detector 22 is powered by power supply 12 via an input 30. The power provided at the input 30 is controlled by low power detector 20. In some embodiments, low power detector 20 provides a detect signal at output 34 to valid signal detector 22. Valid signal detector 22 receives power from power supply 12 via input 30 in response to the detect signal at output 34. In some embodiments, the detect signal also includes the energy or a sample of the energy associated with the signals, disturbances, or other criteria received at input 32. In other embodiments, valid signal detector 22 directly receives the energy at input 32 and stores the energy in response to the detect signal for further analysis. Valid signal detector 22 uses signal strength, pattern and/or duration of the energy to determine if a valid signal exists in some embodiments. In some embodiments, a signal to noise ratio a threshold level or signal duration is compared to a threshold amount of time to validate the energy.

Low power detector 20 is any device or circuit for responding to energy provided at input 32. In some embodiments, low power detector 20 includes a pulse detector, a comparator, a differential amplifier or other device. In some embodiments, a diode and capacitive circuit can be used to detect a time varying signal. In some embodiments, low power detector 20 is a zero power detector that uses the energy at input 32 to provide power for the detection operation.

Valid signal detector 22 is any device or circuit that receives energy detected by low power detector 20 and determines that the energy at input 32 is a valid signal for IC 18. In some embodiments, valid signal detector 22 includes a sampling circuit, a register, a latch, or the device for capturing the energy for validity analysis. In some embodiments, valid signal detector 22 determines an average a signal or a pattern detections and includes a series of registers or sample and hold circuits. In some embodiments, valid signal detector 22 is powered for a short time to reduce power consumption. In some embodiments, valid signal detector 22 includes a timing circuit for determining a time duration of the energy and a comparator for comparing such duration to a threshold to determine validity. In some embodiments, valid signal detector 22 includes a signal-to-noise detector for determining a signal to noise ratio of the energy and a comparator for comparing the ratio to a threshold to determine validity. In some embodiments, valid signal detector 22 includes a filter circuit for determining if the energy is in a frequency range associated with a valid signal and a comparator for comparing the signal in the frequency range to threshold energy level to determine validity. In some embodiments, valid signal detector 22 employs two or more tests for validity (e.g., signal to noise ratio and time duration). Various circuits, processors, application specific circuits, and code can be utilized to perform validity detection.

Figure 2:
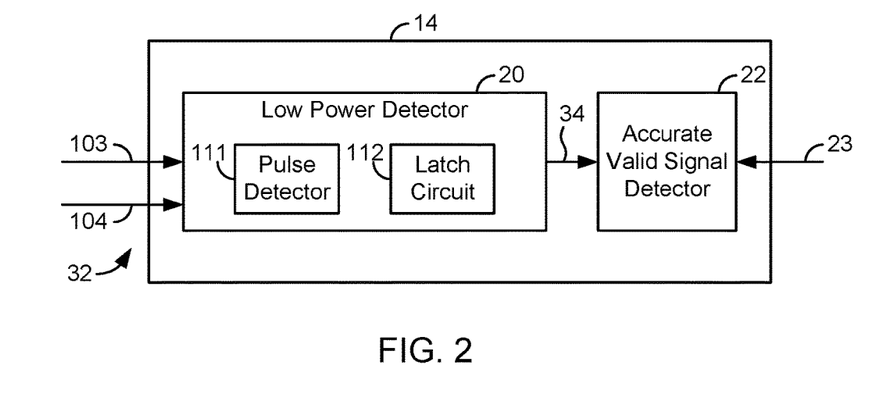
FIG. 2 is a more detailed schematic general block diagram of the two stage power control circuit for use with an IC in accordance with some embodiments.

Referring to FIG. 2, low power detector 20 includes a pulse detector 111 and a latch circuit 112. Input 32 includes differential inputs 103 and 104 in some embodiments. An incoming signal pulse is received at differential inputs 103 and 104 as a differential signal in some embodiments. In some embodiments, the incoming signal is a single pulse with a width greater than 20 nanoseconds (ns) and a differential peak swing greater than 600 millivolts (mV).

Pulse detector 111 includes suitable logic, circuitry, interfaces and/or code that is operable to detect a pulsed incoming signal received by IC 18 at input 32 in some embodiments. The incoming signal is detected by pulse detector 111 based on energy associated with the incoming signal pulse in some embodiments. The pulse detector 111 is operable to amplify the detected signal pulse by level shifting with a DC bias voltage such as, for example, a 400 mV bias voltage. A latch signal may be generated by the pulse detector 111 to turn on latch circuit 112. The latch signal is generated by holding the amplified signal pulse for a first particular time period so as to turn on latch circuit 112 in some embodiments.

Latch circuit 112 includes suitable logic, circuitry, interfaces and/or code that may be operable to turn on power switches or regulators for supplying power to valid signal detector 22 via input 30 (FIG. 1) in some embodiments. In some embodiments, latch circuit 112 is operable to hold the power switches or regulators on for a particular time period during the powering of valid signal detector 22. The latch signal provides a control signal for turning on the power switches or regulators via an input 34 in some embodiments.

Valid signal detector 22 includes suitable logic, circuitry, interfaces and/or code that is operable to control the power to IC 18 via input 32 during a powering on or a powering down of IC 18 in some embodiments. Valid signal detector 22 also includes suitable logic, circuitry, interfaces and/or code that is operable to control the power to valid signal detector 22 via input 30 during a validity analysis of the signal of IC 18. Valid signal detector 22 includes registers, signal to noise detectors, and other devices for determining the validity of the signal in some embodiments. While IC 18 is fully powered and operations of IC 18 are finished or stopped, valid signal detector 22 is operable to turn off the power to IC 18 and to valid signal detector 22 based upon receiving a signal from IC 18 at an input 23. In some embodiments, IC 18 includes a self-contained power on control or power management circuit that interfaces with valid signal detector 22.

Figure 3:
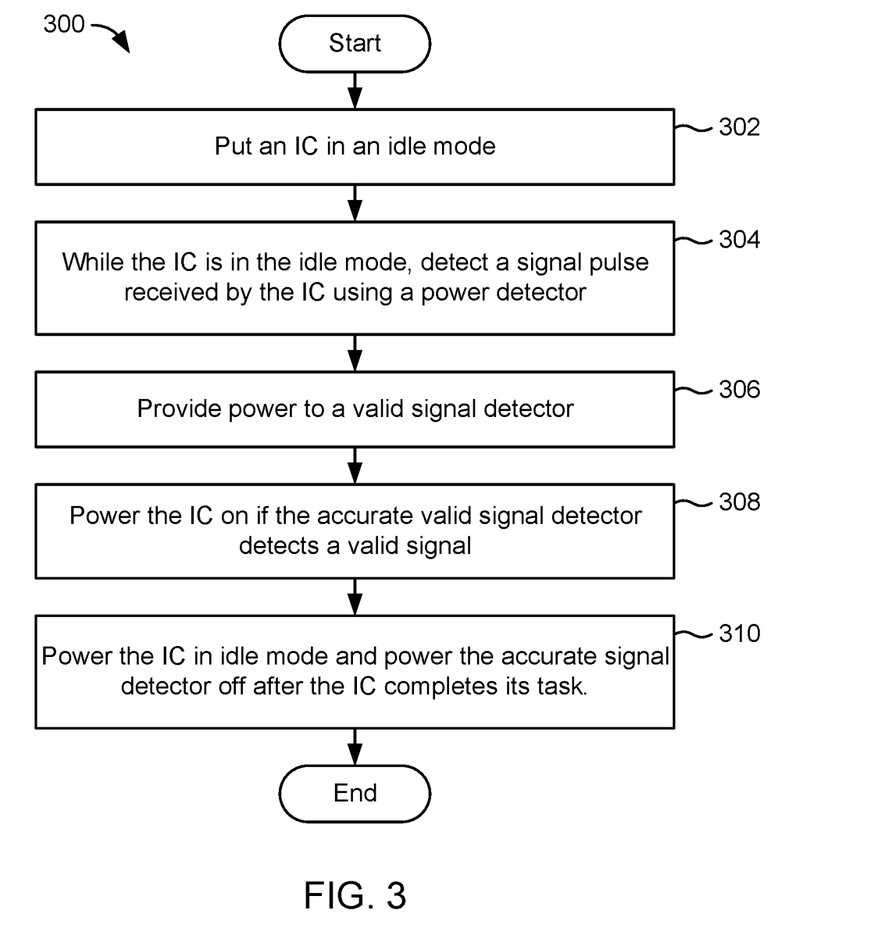
FIG. 3 is a flow diagram showing operation of the circuit illustrated in FIG. 1 in accordance with some embodiments.

Referring to FIGS. 1 and 3, system 10 operates according to a flow 300 in some embodiments. At an operation 302, IC 18 is placed in an idle mode due to inactivity or completion of an operation. At an operation 304, a signal for IC 18 is detected by low power detector 20. At an operation 306, valid signal detector 22 is provided power in response to operation 304. At an operation 308, IC 18 is provided power in response to a valid signal being detected by valid signal detector 22. At an operation 310, IC 18 enters the idle mode after its operation is completed (e.g., the signal at input 32 is processed) and power is removed from valid signal detector 22.

Figure 4:
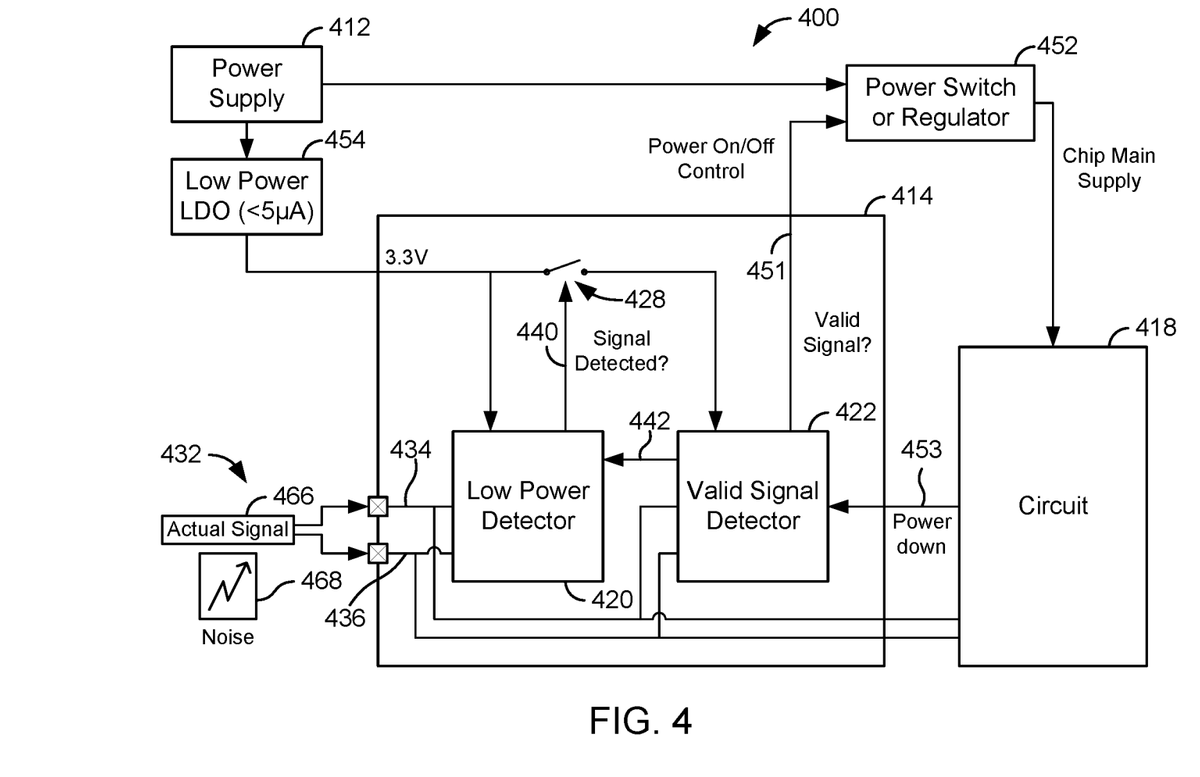
FIG. 4 is a general block diagram of a circuit including a two stage power control circuit for use with an Ethernet device in accordance with some embodiments.

Referring to FIG. 4, a system 400 is similar to system 10 and includes a power supply 412, a power control circuit 414, a circuit 418, a power switch 452, and a low power regulator 454. System 400 can be any type of electronic system or device including a communication, computing, sensing, storage or other device.

Circuit 418 can be any part of system 400. In some embodiments, circuit 418 includes, is part of, or associated with a physical layer circuit (e.g., an automotive Ethernet physical layer circuit). Circuit 418 can be configured for communication with other circuits (e.g., a central unit of an Automotive Ethernet) via an input 432 in some embodiments. Circuit 418 is any type of IC including but not limited to an IC for a network, a hotspot, a computer, a phone, a tablet, a camera, a storage device, a sensor, a display, a microphone, a speaker, an electronic automotive component, or a medical device. In some embodiments, circuit 418 is a physical layer circuit and includes one or more of a transmitter, a receiver, a decoder, an encoder, a media independent interface (MII) manager, a LED controller and/or a voltage regulator IC. Circuit 418 is a communication system chip, a MAC circuit and/or other network components in some embodiments. Input 432 includes differential inputs 434 and 436 in some embodiments.

Power control circuit 414 is part of circuit 418 or is separate from circuit 418 in some embodiments. Power control circuit 414 includes a power switch 428, a low power detector 420, and a valid signal detector 422 in some embodiments. In some embodiments, power switch 428 is part of circuit 418 or separate from circuit 418 and power control circuit 414. In some embodiments, low power detector 420 and valid signal detector 422 are coupled to differential inputs 434 and 436. Power switch 428 can be considered part of low power detector 420 or valid signal detector 422 in some embodiments.

Power supply 412 is any system or device for providing power to low power regulator 454 and power switch 452 and can be similar to power supply 12 (FIG. 1) in some embodiments. Power supply 412 is a car battery, alternator and regulator circuitry associated therewith in some embodiments.

Power supply 412 is coupled to low power regulator 454 which is coupled to power switch 428 and low power detector 420. Low power regulator 454 is an ultra-low power regulator (e.g., a low-dropout voltage regulator). Low power regulator 454 provides a low voltage signal (e.g., 3.3 VDC) to power switch 428 and to low power detector 420 in some embodiments. Power switch 428 is a power field effect field effect transistor (PFET) or a controllable voltage regulator in some embodiments. The voltage levels and signals discussed above are exemplary only; other voltage levels and signals can be utilized.

Power control circuit 414 is similar to power control circuit 14 (FIG. 1) and includes two stages in some embodiments. In some embodiments, the first stage includes low power detector 420 and a second stage includes valid signal detector 422. Low power detector 420 detects energy at input 432 such as signals, disturbances, or other criteria indicative of a need or desire to wake up circuit 418. In some embodiments, input 432 is a data line, signal line, or other input for an automotive Ethernet device. Differential inputs 436 and 434 of input 432 can be associated with an Ethernet twisted pair interface for circuit 418.

The energy at input 432 is an actual signal 466, noise 468, or a combination thereof. Noise 468 is electromagnetic energy from an environment (e.g., automotive environment) in some embodiments. When the energy is above a threshold, the low power detector 420 closes power switch 428 via a control line 440 and provides power from low power regulator 454 to valid signal detector 422. When powered, valid signal detector 422 validates the signal. Valid signal detector 422 detects if the actual signal is present in the validation operation in some embodiments. If the signal is validated, valid signal detector 422 causes power to be provided from power switch 428 to circuit 418 via a signal on a control line 451. Valid signal detector 422 receives power at a current of less than 500 microamps (µA) via power switch 428 during validity detection in some embodiments. When operation of circuit 418 is complete, valid signal detector 422 turns off power switch 452 in response to a power down signal at an input 453 and low power detector 420 turns off power switch 428 in response to a signal from valid signal detector 422 at an input 442.

Low power detector 420 is similar to low power detector 20 and valid signal detector 422 is similar to valid signal detector 22 (FIG. 1) in some embodiments. In some embodiments, low power detector 420 is powered by a power signal having a current of less than 5 µA and valid signal detector 422 is not powered until low power detector 420 detects energy.

Power switch 452 is a power field effect field effect transistor or a controllable voltage regulator in some embodiments. Power switch 452 provides power from power supply at 3.3 VDC, 5 VDC, or 12 VDC in response to the signal on control line 451 from valid signal detector 422 in some embodiments.

Figure 5:
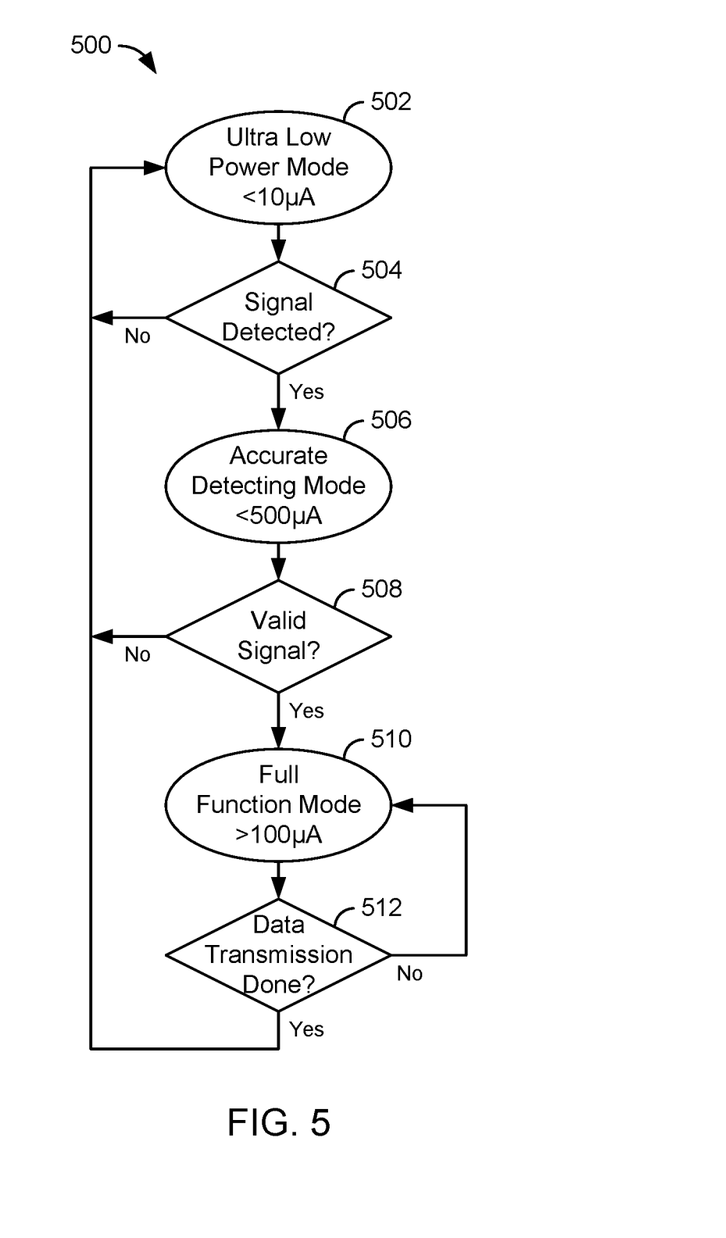
FIG. 5 is a flow diagram showing operation of the circuit illustrated in FIG. 4 in accordance with some embodiments.

Referring to FIGS. 4 and 5, system 400 operates according to a flow 500 in some embodiments. At an operation 502, circuit 418 is placed in an idle mode due to inactivity or completion of an operation. In the idle mode, power switches 428 and 452 are off. The combination of circuit 418 and power control circuit 414 have a power drain of less than 5 µA when power switches 428 and 452 are off in some embodiments. At an operation 504, low power detector 420 detects if energy is at inputs 434 and 436. If energy is not detected, flow 500 returns to operation 502. If energy is detected, flow 500 advances to an operation 506. In some embodiments, low power energy detector 420 operates in an ultra-low power mode (e.g., current drain less than 5 µA) during operation 504 and circuit 418 and valid signal detector 422 consume no power or negligible from power supply 412.

At an operation 506, valid signal detector 422 is provided power by closing power switch 428 via control line 440 and operates in a power mode higher than the ultra-low power mode associated with the operation of low power detector 420 in operation 504. At an operation 508, valid signal detector 422 determines if the energy includes actual signal 466 using approximately 500 µA or less during validity detection in some embodiments. If not, flow 500 returns to operation 502 and power switch 428 is opened. If so, flow 500 advances to an operation 510.

At operation 510, valid signal detector 422 closes power switch 452 via control line 451 and normal operational power (e.g., greater than 100 µA) is provided to circuit 418. At an operation 512, flow advances to operation 502 when circuit 418 completes its operation (e.g., completes its data communication or transmission) and advances to operation 510 if the operation is not complete and continues to operate in a normal operational power mode. Valid signal detector 422 receives an indication that the operation of circuit 418 is complete (e.g., an idle mode or power down signal) via input 453 and turns off power switch 452 in some embodiments. In some embodiments, valid signal detector 422 provides a signal at input 442 that causes low power detector 420 to turn off power switch 428 in response to the indication at input 453 from circuit 418. The indication can be provided as part of the idle mode operations of circuit 418. At operation 512, switches 428 and 452 are opened.

In some embodiments, at operation 510, valid signal detector 422 is powered down via power switch 428 to reduce power consumption. In some embodiments, valid signal detector 422 is powered back on in response to the indication that the operation of circuit 418 is complete via input 453 at operation 512 and turns power switches 428 and 452 off for operation 502. In some embodiments, low power detector 420 turns off power switch 428.

It should be noted that certain passages of this disclosure use labels in connection with devices and signals for purposes of identifying or differentiating one from another or from others. These labels are not intended to relate entities temporally or according to a sequence, although in some cases, these entities can include such a relationship. Nor do these terms limit the number of possible entities (e.g., devices) that can operate within a system or environment.

It should be understood that the systems described above can provide multiple ones of any or each of those components and these components can be provided on either an integrated circuit or, in some embodiments, on multiple circuits, circuit boards or discrete components. In addition, the systems and methods described above can be adjusted for various system parameters and design criteria, such as output voltage level, power requirements, power supply levels, etc. Although shown in the drawings with certain components directly coupled to each other, direct coupling is not shown in a limiting fashion and is exemplarily shown. Alternative embodiments include circuits with indirect coupling between the components shown. Alternative embodiments can drive certain components with signals that are buffered, amplified, inverted, etc. with respect to the signals described herein.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A power control circuit comprising:
    a first circuit configured to cause first power to be provided to a second circuit in response to detection of energy; and
    the second circuit, in response to receiving the first power, configured to:
        detect a characteristic of a signal associated with the energy detected by the first circuit;
        validate the signal based at least in part on the detected characteristic of the signal; and
        cause second power to be provided to a third circuit in response to the signal being validated.

2. The power control circuit of claim 1, wherein at least one of the first circuit, the second circuit, or the third circuit is an automotive device.

3. The power control circuit of claim 1, wherein the first circuit comprises a low power detector, and the second circuit comprises a signal detector.

4. The power control circuit of claim 1, wherein the third circuit comprises an Ethernet circuit.

5. The power control circuit of claim 1, wherein the signal associated with the energy detected by the first circuit is coupled to the second circuit.

6. The power control circuit of claim 1, wherein the first circuit is a low power detector comprising a pulse detector and a latch circuit.

7. The power control circuit of claim 1, wherein the first circuit operates using a supply current that is less than a supply current used by the second circuit.

8. The power control circuit of claim 1, further comprising a first switch coupled to the first circuit, wherein the first circuit turns on the first switch to cause the first power to be provided to the second circuit in response to the detection of the energy.

9. The power control circuit of claim 1, further comprising a second switch coupled to the second circuit, wherein the second circuit turns on the second switch to cause the second power to be provided from a power supply to the third circuit in response to the signal being validated.

10. The power control circuit of claim 9, wherein the second circuit turns off the second switch to remove the second power in response to an operation of the third circuit being finished.

11. The power control circuit of claim 1, wherein the characteristic of the signal comprises at least one of a strength of the signal, a pattern of the signal, or a duration of the signal.

12. The power control circuit of claim 1, wherein the second circuit validates the signal by examining at least one of a signal strength of the signal, a pattern of the signal, or a duration of the signal.

13. A system comprising:
a first circuit;
a second circuit; and
a third circuit, wherein:
the first circuit is configured to cause first power to be provided to the second circuit in response to detection of a signal;
the second circuit, in response to receiving the first power, configured to validate the signal detected by the first circuit and cause second power to be provided to the third circuit; and
the third circuit, in response to receiving the second power, configured to process the signal detected by the first circuit and validated by the second circuit.

14. The system of claim 13, wherein the third circuit is an automotive device operating in an automotive environment.

15. The system of claim 13, wherein the first circuit comprises a low power detector, and the second circuit comprises a signal detector, and the third circuit comprises an Ethernet circuit.

16. The system of claim 13, wherein first power is less than the second power.

17. The system of claim 13, further comprising a first switch coupled to the first circuit, wherein the first circuit turns on the first switch to cause the first power to be provided to the second circuit in response to the detection of the signal.

18. The system of claim 13, further comprising a second switch coupled to the second circuit, wherein the second circuit is configured to:
turn on the second switch to cause the second power to be provided from a power supply to the third circuit in response to the signal being validated; and
turn off the second switch to remove the second power in response to an operation of the third circuit being finished.

19. An apparatus comprising:
a first circuit, in a first power mode, configured to detect a signal; and
a second circuit, in a second power mode, configured to validate the signal detected by the first circuit and cause power to be provided to a third circuit in response to the signal being validated,
wherein the first power mode consumes less power than the second power mode.

20. The apparatus of claim 19, wherein the third circuit processes the signal detected by the first circuit and validated by the second circuit in response to receiving the power.

* * * * *